US009112110B2

(12) United States Patent
Totani et al.

(10) Patent No.: US 9,112,110 B2
(45) Date of Patent: Aug. 18, 2015

(54) SEMICONDUCTOR LIGHT EMITTING ELEMENT AND METHOD FOR MANUFACTURING THE SAME

(71) Applicant: Toyoda Gosei Co., LTD., Kiyosu-shi (JP)

(72) Inventors: Shingo Totani, Kiyosu (JP); Masashi Deguchi, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 18 days.

(21) Appl. No.: 13/958,422

(22) Filed: Aug. 2, 2013

(65) Prior Publication Data
US 2014/0070227 A1    Mar. 13, 2014

(30) Foreign Application Priority Data

Sep. 13, 2012 (JP) .................. 2012-202089

(51) Int. Cl.
*H01L 21/00* (2006.01)
*H01L 33/32* (2010.01)
*H01L 33/42* (2010.01)
*H01L 33/38* (2010.01)

(52) U.S. Cl.
CPC .............. *H01L 33/32* (2013.01); *H01L 33/42* (2013.01); *H01L 33/38* (2013.01); *H01L 2933/0016* (2013.01)

(58) Field of Classification Search
CPC ............ H01L 29/7869; H01L 27/1225; H01L 29/66969; H01L 21/02565; H01L 27/124; H01L 27/1214; H01L 27/1248; H01L 27/3244; H01L 29/78693; H01L 21/02554; H01L 27/3246; H01L 27/3258; H01L 51/5237
USPC ................ 257/43, 40, 98, E29.296, E33.072, 257/E51.018, E21.46, 29.273, E33.053, 257/E33.062, E33.064, E51.026, 72, 88, 257/99, E21.091, E21.411, E21.461, 257/E21.475, E21.476, E21.698, E29.068, 257/E31.026, E31.047, E31.108, E31.127, 257/E33.003, E33.004, E33.06, E33.063, 257/E51.007, E51.022, 13, 432, 53, 57, 59, 257/71, 12, 296, 314, 347, 42, 66, 734, 76, 257/77, 784, 79, 82, 89; 438/104, 34, 158, 438/23, 28, 29, 37, 478, 687, 73, 75, 99; 349/194, 42, 43, 46, 48, 61, 98; 359/489.07, 275
See application file for complete search history.

(56) References Cited

U.S. PATENT DOCUMENTS

2010/0059760 A1    3/2010 Miki
2012/0061642 A1*   3/2012 Tanaka ........................... 257/13

FOREIGN PATENT DOCUMENTS

| JP | 2008-177514 A | 7/2008 |
| JP | 2008-227109 A | 9/2008 |
| JP | 2011-210847 A | 10/2011 |
| JP | 2012-69860 A  | 4/2012 |

* cited by examiner

*Primary Examiner* — Robert Bachner
(74) *Attorney, Agent, or Firm* — McGinn IP Law Group, PLLC (57) ABSTRACT

A method for manufacturing a semiconductor light emitting element comprises steps of forming a semiconductor layer composed of a Group III nitride based compound semiconductor on a principal surface of a substrate; forming a transparent conductive metal oxide film on the semiconductor layer; forming an electrode above the transparent conductive metal oxide film; forming a mask layer for covering a part of the transparent conductive metal oxide film; and heat treating the transparent conductive metal oxide film having the mask layer formed thereon in an oxygen-containing atmosphere; wherein, in the heat treatment step, an oxygen concentration of a remaining part of the transparent conductive metal oxide film which is not covered by the mask layer is made higher than an oxygen concentration of a part of the transparent conductive metal oxide film which is covered by the mask layer.

16 Claims, 6 Drawing Sheets

SEMICONDUCTOR LIGHT EMITTING ELEMENT AND METHOD FOR MANUFACTURING THE SAME

BACKGROUND OF THE INVENTION

1. Field of the Invention

The present invention relates to a semiconductor light emitting element and a method for manufacturing the same. In more detail, the present invention relates to a semiconductor light emitting element contriving to allow an electric current to diffuse in a transparent electrode film and a method for manufacturing the same.

2. Description of the Related Art

In general, a semiconductor light emitting element includes a light emitting layer, an n-type layer, and a p-type layer. In each of the n-type layer and the p-type layer, an electrode is formed. When an electric current to be injected from the electrode diffuses more sufficiently within a light emitting surface of the light emitting layer, the luminous efficiency of the semiconductor light emitting element becomes higher.

Accordingly, technologies for contriving to allow an electric current to diffuse within the light emitting surface have been being developed. For example, JP-A-2012-69860 discloses a semiconductor light emitting element including a first transparent electrode film and a second transparent electrode film. A pad electrode is formed on the second transparent electrode film (see FIG. 1, etc. of JP-A-2012-69860). The first transparent electrode film is lower in terms of a contact resistance and higher in terms of a sheet resistance than the second transparent electrode film (see Table 1 in paragraph [0040] of JP-A-2012-69860).

In other words, the second transparent electrode film beneath the pad electrode has properties of allowing the electric current to diffuse easily into the transverse direction, namely the principal surface direction of a substrate of the semiconductor light emitting element. In addition, the first transparent electrode film has properties of allowing the electric current to flow easily into the longitudinal direction, namely the film thickness direction in the first transparent electrode film. According to this, the electric current is allowed to diffuse within the light emitting surface.

However, in the semiconductor light emitting element disclosed in JP-A-2012-69860, the first transparent electrode film and the second transparent electrode film are a separate body from each other. Accordingly, there is present a contact resistance therebetween. In consequence, there is a concern that the electric current does not flow sufficiently.

SUMMARY OF THE INVENTION

In order to solve the foregoing problem accompanied by the related art, the present invention has been made. Specially, an object of the present invention is to provide a semiconductor light emitting element contriving to allow an electric current to diffuse sufficiently within the light emitting surface of a semiconductor layer and a method for manufacturing the same.

A method for manufacturing a semiconductor light emitting element according to a first aspect of the present invention includes a semiconductor layer forming step of forming a semiconductor layer composed of a Group III nitride based compound semiconductor on the principal surface of a substrate; a transparent conductive metal oxide film forming step of forming a transparent conductive metal oxide film on the semiconductor layer; and an electrode forming step of forming an electrode on the transparent conductive metal oxide film. In addition, the method includes a mask layer forming step of forming a mask layer for covering a part of the transparent conductive metal oxide film; and a heat treatment step of heat treating the transparent conductive metal oxide film having the mask layer formed thereon in an oxygen-containing atmosphere. In the heat treatment step, an oxygen concentration of the remaining part of the transparent conductive metal oxide film which is not covered by the mask layer is made higher.

According to this method for manufacturing a semiconductor light emitting element, a low oxygen concentration region and a high oxygen concentration region are formed in the transparent conductive metal oxide film. In this semiconductor light emitting element, an electric current diffuses sufficiently within the light emitting surface. In the low oxygen concentration region in the transparent conductive metal oxide film, the electric current flows easily into the transverse direction within the light emitting surface. In the high oxygen concentration region in the transparent conductive metal oxide film, the electric current flows easily toward the semiconductor layer. In this way, the electric current diffuses sufficiently within the light emitting surface, and hence, the luminous efficiency of the semiconductor light emitting element is good.

In the method for manufacturing a semiconductor light emitting element according to a second aspect of the present invention, the mask layer is an insulating layer. At least a part of the insulating layer is made to remain on the transparent conductive metal oxide film. In other words, an exposed area of the transparent conductive metal oxide film, which is not covered by the insulating layer, is oxidized without oxidizing an area of the transparent conductive metal oxide film, which is covered by the insulating layer.

In the method for manufacturing a semiconductor light emitting element according to a third aspect of the present invention, the mask layer is an insulating layer and an electrode. At least a part of each of the insulating layer and the electrode is made to remain on the transparent conductive metal oxide film. In other words, exposed areas of the transparent conductive metal oxide film, which are not covered by the insulating layer and the electrode, are oxidized without oxidizing areas of the transparent conductive metal oxide film, which are covered by the insulating layer and the electrode.

In the method for manufacturing a semiconductor light emitting element according to a fourth aspect of the present invention, after the heat treatment step, a mask layer removing step of removing the mask layer from the transparent conductive metal oxide film is included. After the mask layer removing step, an electrode forming step is performed.

In the method for manufacturing a semiconductor light emitting element according to a fifth aspect of the present invention, prior to the mask layer forming step, a heat treatment step of performing a heat treatment in an oxygen-free atmosphere is included, and a heat treatment temperature in the heat treatment step in an oxygen-free atmosphere is higher than a heat treatment temperature in a heat treatment step in an oxygen-containing atmosphere.

A semiconductor light emitting element according to a sixth aspect of the present invention includes a substrate; a semiconductor layer composed of a Group III nitride based compound semiconductor formed on the principal surface of a substrate; a single transparent conductive metal oxide film formed on the semiconductor layer; and a wiring electrode conducting to the transparent conductive metal oxide film. In addition, the transparent conductive metal oxide film includes a low oxygen concentration region having a low oxygen concentration and a high oxygen concentration region having a higher oxygen concentration than the low oxygen concentration region. The wiring electrode is formed within a region width of the low oxygen concentration region.

The semiconductor light emitting element according to a seventh aspect of the present invention includes an insulating layer covering the low oxygen concentration region on the transparent conductive metal oxide film. The wiring electrode includes a plurality of contact portions coming into contact with the transparent conductive metal oxide film and a wiring portion electrically connecting the contact portions to each other and formed on the insulating layer. The wiring portion is formed along the insulating layer. The contact portions come into contact with the low oxygen concentration region. Accordingly, an electric current to be injected from the contact portions diffuses into the direction within the light emitting surface in the low oxygen concentration region.

In the semiconductor light emitting element according to an eighth aspect of the present invention, the material of the transparent conductive metal oxide film is a compound obtained by adding $In_2O_3$ with other metal.

In the semiconductor light emitting element according to a ninth aspect of the present invention, the material of the transparent conductive metal oxide film is ITO or IZO. In this transparent conductive metal oxide film, in the low oxygen concentration region, the contact resistance is relatively high, and the sheet resistance is relatively low. On the other hand, in the high oxygen concentration region, the contact resistance is relatively low, and the sheet resistance is relatively high.

According to the present invention, a semiconductor light emitting element contriving to allow an electric current to diffuse sufficiently within the light emitting surface of a semiconductor layer and a method for manufacturing the same are provided.

DESCRIPTION OF THE PREFERRED EMBODIMENTS

Figure 1:
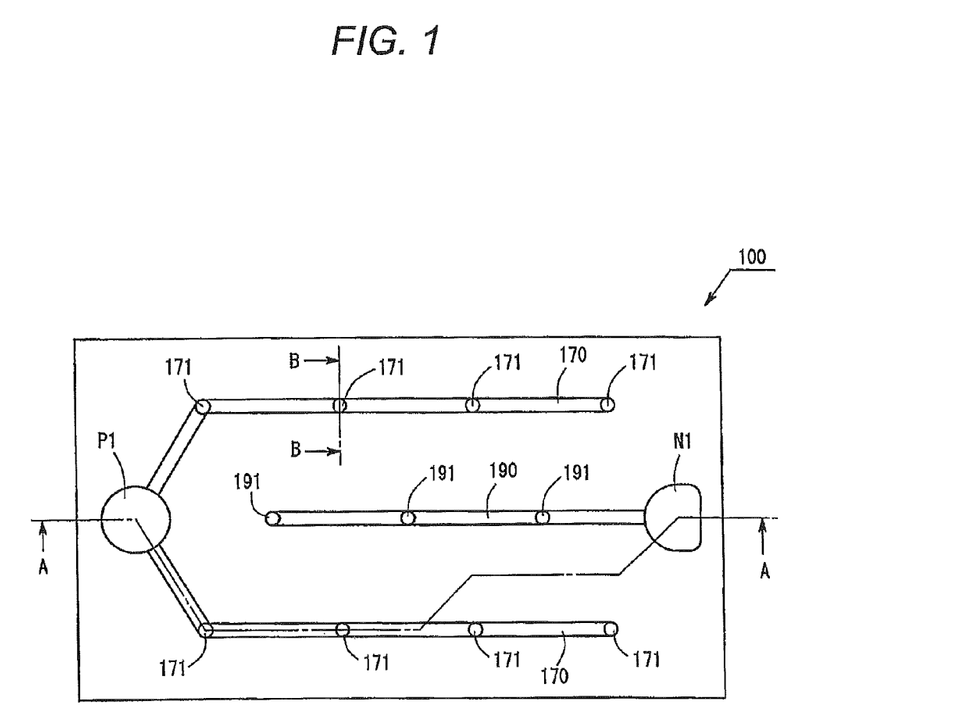
FIG. 1 is a plan view showing a semiconductor light emitting element according to Embodiment 1.
Figure 2:
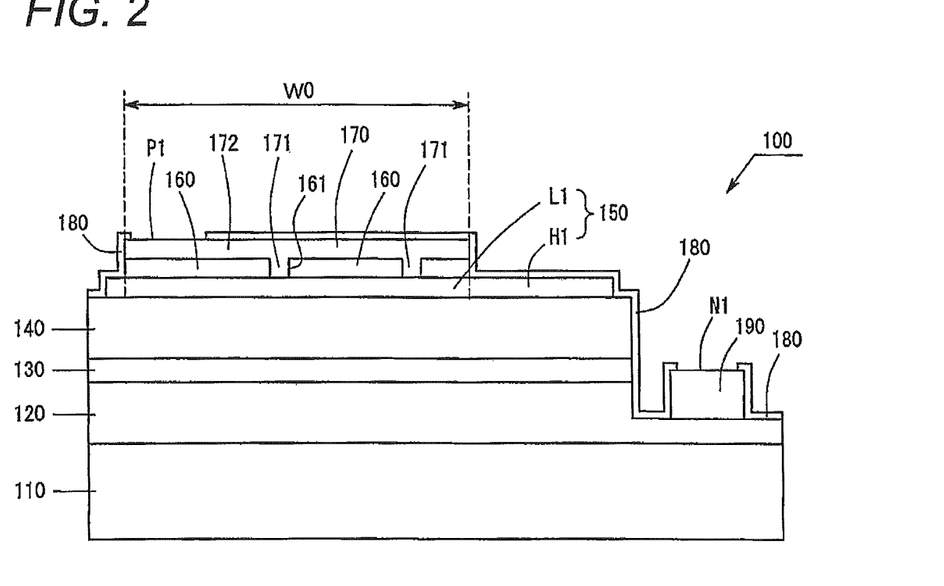
FIG. 2 is a cross-sectional view showing a diagrammatic configuration of a semiconductor light emitting element according to Embodiment 1.

Specific embodiments are hereunder described by exemplifying semiconductor light emitting elements while referring to the accompanying drawings. But, it should not be construed that the present invention is limited to these embodiments. In addition, a laminate structure and an electrode structure of each of layers of each of semiconductor light emitting elements as described later are illustrations. As a matter of course, laminate structures different from those in the following embodiments may be adopted. The cross-sectional structures in the respective drawings are shown in a conceptual manner. For example, it should be construed that the thickness of each layer does not show the actual thickness.
(Embodiment 1)
1. Semiconductor Light Emitting Element:

FIG. 1 is a plan view showing a light emitting element 100 according to the present embodiment. FIG. 2 is a cross-sectional view showing diagrammatically an A-A cross section of FIG. 1. The light emitting element 100 is a face-up type semiconductor light emitting element. A wiring electrode 170 is formed along the upper portion of an insulating layer 160. The light emitting element 100 includes a substrate 110, an n-type layer 120, a light emitting layer 130, a p-type layer 140, a transparent conductive metal oxide film 150, the insulating layer 160, the wiring layer 170, an insulating film 180, and a wiring electrode 190.

As shown in FIG. 1, in the light emitting element 100, the wiring electrode 170 on the p-side and the wiring electrode 190 on the n-side are engaged with each other in a comb-like state. The wiring electrode 170 comes into contact with the transparent conductive metal oxide film 150 in contact portions 171. The wiring electrode 190 comes into contact with an n-type contact layer of the n-type layer 120 in contact portions 191. The wiring electrodes 170 and 190 are covered by the insulating film 180. But, the wiring electrodes 170 and 190 are exposed in areas of exposed portions P1 and N1, respectively. The exposed portions P1 and N1 are each a part of the wiring electrodes 170 and 190, respectively.

The substrate 110 is a supporting substrate for supporting the semiconductor layer of the n-type layer 120, etc. In addition, the substrate 110 is also a growth substrate for allowing the n-type layer 120, etc. to grow. Examples of the material of the substrate 110 which can be used include sapphire, Si, and SiC. In addition, a material in which an irregular shape is formed on the principal surface thereof may also be used.

The n-type layer 120, the light emitting layer 130, and the p-type layer 140 are each a semiconductor layer composed of a Group III nitride based compound semiconductor. The n-type layer 120 is formed on the principal surface of the substrate 110. The n-type layer 120 is formed of an n-type contact layer, an N-type ESD layer, and an n-type SL layer in this order from the side of the substrate 110. In addition, while illustration is omitted in FIG. 2, a buffer layer may be provided between the substrate 110 and the n-type layer 120. The light emitting layer 130 is formed on the n-type layer 120. The light emitting layer 130 is an MQW layer. Alternatively, the light emitting layer 130 may also be an SQW layer. The p-type layer 140 is formed on the light emitting layer 130. The p-type layer 140 is a layer in which a p-type clad layer and a p-type contact layer are formed in this order from the side of the light emitting layer 130. These are illustrations to the bitter end, and other configurations may also be adopted.

The transparent conductive metal oxide film 150 is formed over the entirety of the upper surface of the p-type contact layer of the p-type layer 140. The material of the transparent conductive metal oxide film 150 may be, for example, ITO or IZO. Alternatively, the material of the transparent conductive metal oxide film 150 may also be a compound obtained by adding $In_2O_3$ with other metal. The transparent conductive metal oxide film 150 is a film made of a single layer and also includes a low oxygen concentration region L1 and a high oxygen concentration region H1. The low oxygen concentration region L1 is disposed beneath the insulating layer 160 and the contact portions 171. The high oxygen concentration region H1 is a region other than the low oxygen concentration region L1. Details thereof are described later.

The insulating layer 160 is a layer for covering a part of the transparent conductive metal oxide film 150. By providing the insulating layer 160, light reflects easily between the transparent conductive metal oxide film 150 and the insulating layer 160. In other words, the insulating layer 160 suppresses the absorption of light by the wiring electrode 170 and plays a role of enhancing the luminous efficiency. Accordingly, the insulating layer 160 is formed along the wiring electrode 170. In addition, in order to bring the contact portions 171 into contact with the transparent conductive metal oxide film 150, holes 161 are provided. In other words, each of the contact portions 171 is disposed in the inside of each of the holes 161. In addition, the insulating layer 160 also plays a role as a mask layer for forming the low oxygen concentration region L1 and the high oxygen concentration region H1. Examples of the material of the insulating layer 160 include $SiO_2$ and $TiO_2$.

The wiring electrode 170 is formed on the insulating layer 160. In addition, the wiring electrode 170 includes the contact portions 171 and a wiring portion 172. The contact portions 171 are a wiring electrode coming into contact the low oxygen concentration region L1 in the transparent metal oxide film 150. The contact portions 171 fill the plurality of holes 161 which are separated from each other in the insulating layer 160. Each of the contact portions 171 comes into contact with the transparent conductive metal oxide film 150 in the bottom of each of the holes 161. The wiring portion 172 is a portion for electrically connecting the contact portions 171 to the p-pad electrode P1. Examples of the wiring electrode 170 include an electrode in which Cr, Ti, and Au are laminated in this order from the side of the p-type layer 140. As a matter of course, other electrode configurations may also be adopted. However, the metal of the lowermost layer is preferably a material with good adhesion to $SiO_2$ or TiC. The same is also applicable to the wiring electrode 190.

The contact portion 171 and the wiring portion 172 may be made of the different material from each other. In that case, the metal of the lowermost layer of the contact portion 171 is preferably a material capable of taking ohmic contact with the transparent conductive metal oxide film 150. The metal of the lowermost layer of the wiring portion 172 is preferably a material with good adhesion to $SiO_2$. In addition, the metal of the lowermost layer of the contact portion 191 is preferably a material capable of taking ohmic contact with the n-type layer 120. The metal of the lowermost layer of the wiring portion 192 is preferably a material with good adhesion to $SiO_2$.

The insulating film 180 is a film for protecting the semiconductor, etc. Accordingly, the insulating film 180 covers the upper surface of the semiconductor layer, etc., namely the transparent conductive metal oxide film 150, the insulating layer 160, and the wiring electrodes 170 and 190. Examples of the material of the insulating film 180 include $SiO_2$ and $TiO_2$.

2. Low Oxygen Concentration Region and High Oxygen Concentration Region:

As shown in FIG. 2, the transparent conductive metal oxide film 150 of the light emitting element 100 includes the low oxygen concentration region L1 and the high oxygen concentration region H1. In other words, the transparent conductive metal oxide film 150 includes a region having a high oxygen concentration and a region having a low oxygen concentration in the inside of a single film.

The low oxygen concentration region L1 is a region which has not been subjected to a heat treatment in an oxygen atmosphere as described later. The high oxygen concentration region H is a region which has been subjected to a heat treatment in an oxygen atmosphere as described later. Accordingly, the oxygen concentration in the high oxygen concentration region H1 is higher than the oxygen concentration in the low oxygen concentration region L1.

As shown in FIG. 2, the low oxygen concentration region L1 is positioned beneath the insulating layer 160 and the contact portions 171. The contact portions 171 come into contact with the low oxygen concentration region L1. The insulating layer 160 and the wiring electrode 170 are formed in the inside of a region width W0 of the low oxygen concentration region L1. On the other hand, the high oxygen concentration region H1 is a region occupying other region than the low oxygen concentration region L1. In other words, neither the insulating layer 160 nor the wiring electrode 170 is formed above the high oxygen concentration region H1.

Properties of the low oxygen concentration region L1 and the high oxygen concentration region H1 are shown in Table 1. Table 1 shows the results obtained by using ITO. When the low oxygen concentration region L1 and the high oxygen concentration region H1 are compared with each other, the following may be said.

Figure 3:
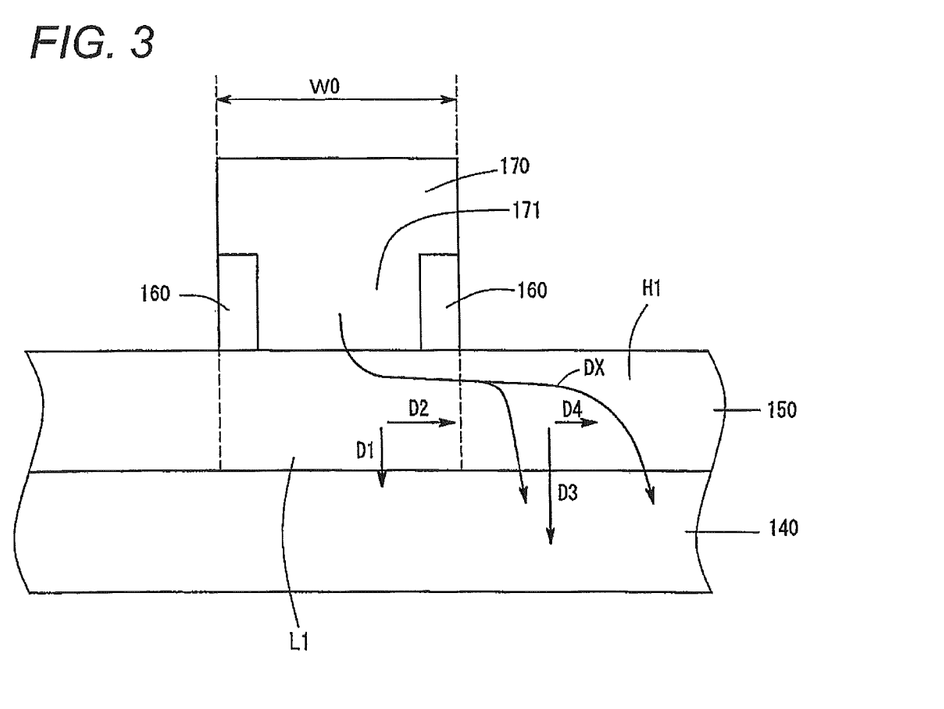
FIG. 3 is a view for explaining easiness of flowing of an electric current in a transparent conductive metal oxide film of a semiconductor light emitting element according to the embodiment.

As compared with the high oxygen concentration region H1, the low oxygen concentration region L1 is relatively high in terms of a contact resistance against the p-type contact layer and relatively low in terms of a sheet resistance. In other words, as shown in FIG. 3 (B-B cross section in FIG. 1), in the low oxygen concentration region L1, an electric current flows hardly in the direction perpendicular to the principal surface of the substrate 110 (direction of an arrow D1) and flows easily in the direction parallel to the principal surface of the substrate 110 (direction of an arrow D2).

On the other hand, as compared with the low oxygen concentration region L1, the high oxygen concentration region H1 is relatively low in terms of a contact resistance against the p-type contact layer and relatively high in terms of a sheet resistance. Accordingly, as shown in FIG. 3, in the high oxygen concentration region H1, an electric current flows easily in the direction perpendicular to the principal surface of the substrate 110 (direction of an arrow D3) and flows hardly in the direction parallel to the principal surface of the substrate 110 (direction of an arrow D4).

As described previously, though the sheet resistance of the high oxygen concentration region H1 is relatively high, as compared with the sheet resistance of the p-type contact layer, the sheet resistance of the high oxygen concentration region H1 is sufficiently low. In consequence, as shown by an arrow DX in FIG. 3, an electric current flows toward the p-type layer 140 while diffusing in the inside of the transparent conductive metal oxide film 150. In this way, in the transparent conductive metal oxide film 150, in the electrode forming region, an electric current component density toward the p-type contact layer is small, and the electric current flows in the direction within the planar surface. In other region than the electrode forming region, the electric current diffuses into the direction within the planar surface and also branches in the direction of the p-type contact layer, and the electric current density toward the light emitting layer increases as compared with that in the electrode forming region. In other words, in the light emitting element 100, the electric current diffuses easily within the light emitting surface, and its luminous efficiency is good. The electrode forming region as referred to herein, means a region where the electrode such as the pad electrode and the wiring electrode occupies in a planar manner in the semiconductor light emitting element. In other words, the electrode forming region refers to a region projecting the planar shape of the electrode in the principal surface direction of the substrate.

In Table 1, a carrier concentration of the low oxygen concentration region L1 is $6.3 \times 10^{20}$ (1/cm$^3$). In addition, in Table 1, a carrier concentration of the high oxygen concentration region H1 is $3.0 \times 10^{20}$ (1/cm$^3$). In this way, the carrier concentration of the low oxygen concentration region L1 is higher than the carrier concentration of the high oxygen concentration region H1. This is because the larger the oxygen deficiency, the higher the carrier concentration is. In other words, by oxidizing the transparent conductive metal oxide film 150, the carrier concentration thereof becomes low. In addition, there is no substantial difference in terms of mobility between the low oxygen concentration region L1 and the high oxygen concentration region H1.

TABLE 1

| | ITO | | | |
|---|---|---|---|---|
| | Contact resistance ($\Omega \cdot cm^2$) | Sheet resistance ($\Omega/\square$) | Carrier concentration (1/cm$^3$) | Mobility (cm$^2$/V·s) |
| L1 | $3.2 \times 10^{-3}$ | 14.1 | $6.3 \times 10^{20}$ | 43.0 |
| H1 | $1.0 \times 10^{-3}$ | 32.2 | $3.0 \times 10^{20}$ | 45.0 |

In addition, the same results regarding IZO are shown in Table 2.

TABLE 2

| | IZO | | | |
|---|---|---|---|---|
| | Contact resistance ($\Omega \cdot cm^2$) | Sheet resistance ($\Omega/\square$) | Carrier concentration (1/cm$^3$) | Mobility (cm$^2$/V·s) |
| L1 | — | 43.6 | $3.4 \times 10^{20}$ | 59.8 |
| H1 | — | 45.1 | $3.1 \times 10^{20}$ | 62.6 |

3. Method for Manufacturing Semiconductor Light Emitting Element:

The method for manufacturing a semiconductor light emitting element according to the present embodiment is a method including the following steps of from Step A to Step I.

(Step A) Semiconductor layer forming step
(Step B) Transparent conductive metal oxide film forming step
(Step C) First heat treatment step (low oxygen concentration region forming step)
(Step D) n-Type layer exposing step
(Step E) Insulating layer forming step
(Step F) Second heat treatment step (high oxygen concentration region forming step)
(Step G) Perforating step
(Step H) Electrode forming step
(Step I) Insulating film forming step These respective steps are carried out in this order.

Figure 4:
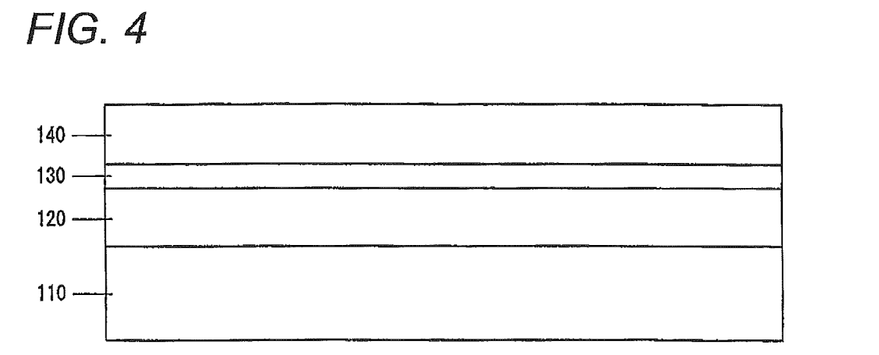
FIG. 4 is a view (Part 1) for explaining a method for manufacturing a semiconductor light emitting element according to the embodiment.

3-1. (Step A) Semiconductor Layer Forming Step:

A semiconductor layer is formed on the substrate 110 by means of metal organic chemical vapor deposition (MOCVD). First of all, a buffer layer is formed on the principal surface of the substrate 110. Subsequently, the n-type layer 120 is formed on the buffer layer. The light emitting layer 130 is then formed on the n-type layer 120. Subsequently, the p-type layer 140 is formed on the light emitting layer 130. A configuration in which the respective semiconductor layers are formed on the substrate 110 is shown in FIG. 4.

Figure 5:
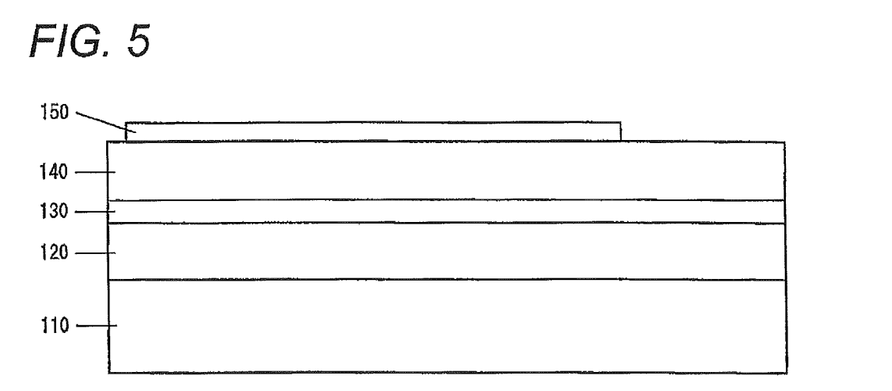
FIG. 5 is a view (Part 2) for explaining a method for manufacturing a semiconductor light emitting element according to the embodiment.

3-2. (Step B) Transparent Conductive Metal Oxide Film Forming Step:

Subsequently, as shown in FIG. 5, the transparent conductive metal oxide film 150 is formed on the p-type layer 140 by means of sputtering. Here, the transparent conductive metal oxide film 150 is formed on the p-type layer 140 excluding an expected area for forming the n-pad electrode N1. As is described previously, as the material of the transparent conductive metal oxide film 150, a compound obtained by adding $In_2O_3$ with other metal is used. Examples thereof include ITO and IZO. In order to form a pattern, any one method of lift-off, wet etching, or dry etching may be adopted. At this stage, the transparent conductive metal oxide film 150 does not get sufficient transparency yet.

3-3. (Step C) First Heat Treatment Step (Low Oxygen Concentration Region Forming Step):

Subsequently, a first heat treatment step is performed. This heat treatment is performed in an oxygen-free atmosphere. For example, the first heat treatment is performed in a nitrogen atmosphere. Examples of a pressure condition include the case of not higher than 10 Pa and the case under an atmospheric pressure. The heat treatment temperature is, for example, 700° C. The heat treatment time is, for example, not more than 300 seconds. However, it should not be construed that the heat treatment conditions are limited thereto. For such a condition, a condition which varies depending upon the material of the transparent conductive metal oxide film 150 and the like may be set up. According to this heat treatment, the transparent conductive metal oxide film 150 gets transparency.

Though this heat treatment was made to be performed in a nitrogen atmosphere, the heat treatment may be performed with other gas so long as the gas is an inert gas. However, the gas to be used is an oxygen-free gas. At this stage, the oxygen concentration of the transparent conductive metal oxide film 150 is the same degree as that in the low oxygen concentration region L1. The contact resistance and the like are also the same degrees as those in the low oxygen concentration region L1 as shown in Table 1.

Figure 6:
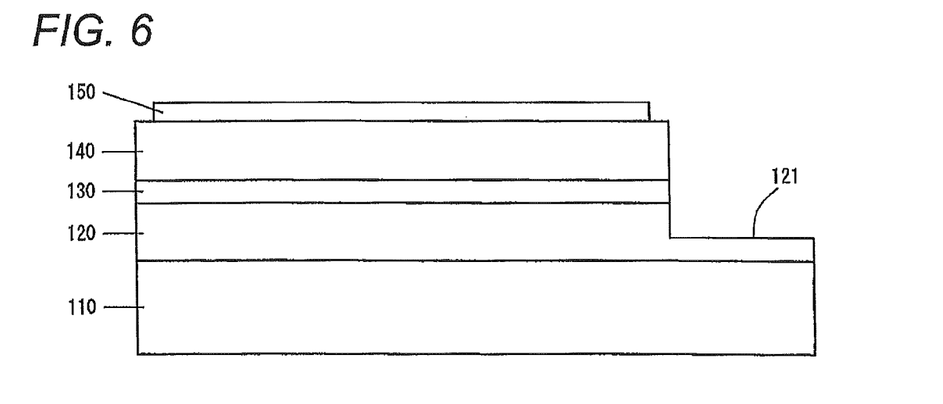
FIG. 6 is a view (Part 3) for explaining a method for manufacturing a semiconductor light emitting element according to the embodiment.

3-4. (Step D) n-Type Layer Exposing Step:

Subsequently, as shown in FIG. 6, a part of the semiconductor layer is bored to expose a part of the n-type layer 120.

An exposed area 121 thereof is an area of the exposed portion N1. Accordingly, after lithography, dry etching may be performed.

Figure 7:
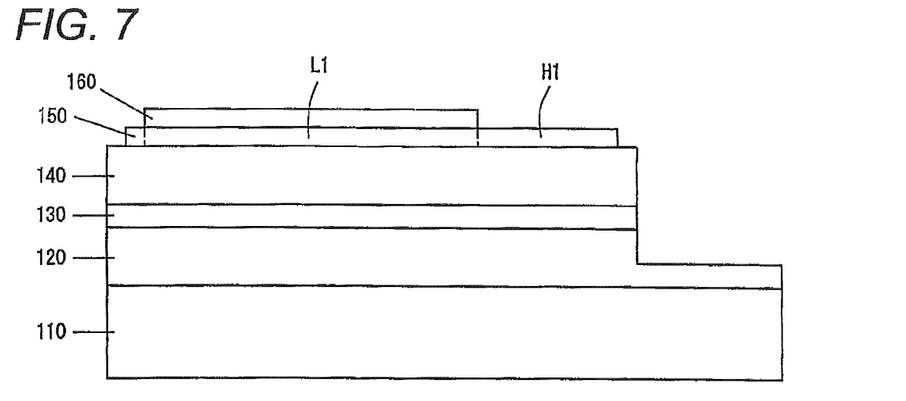
FIG. 7 is a view (Part 4) for explaining a method for manufacturing a semiconductor light emitting element according to the embodiment.

3-5. (Step E) Insulating Layer Forming Step:

Subsequently, as shown in FIG. 7, the insulating layer 160 is formed on a part of the transparent conductive metal oxide film 150. An area where the insulating layer 160 is formed is an electrode forming area. In other words, the area where the insulating layer 160 is formed is a position of the wiring electrode 170 to be formed after that. In order to form the insulating layer 160, the CVD method may be adopted. Here, the insulating layer 160 is a mask layer for preventing oxidation of the covered area of the transparent conductive metal oxide film 150 from occurring in a second heat treatment step as described later. In other words, this step is also a mask layer forming step.

3-6. (Step F) Second Heat Treatment Step (High Oxygen Concentration Region Forming Step):

Subsequently, the transparent conductive metal oxide film 150 having a mask layer formed therein is subjected to a heat treatment in an oxygen-containing atmosphere. For example, the heat treatment is performed in an $O_2$ atmosphere of 25 Pa. The heat treatment temperature is 550° C. According to this heat treatment, the exposed area of the transparent conductive metal oxide film 150 is oxidized. Examples of the material of the transparent conductive metal oxide film 150 include oxides such as ITO and IZO. The oxidation as referred to herein means that oxygen is bound to the area of oxygen deficiency. In other words, as described previously, it is meant that the carrier concentration decreases.

The area of the transparent conductive metal oxide film 150, which is not covered by the insulating layer 160, becomes the high oxygen concentration region H1 by this oxidation. On other hand, the area of the transparent conductive metal oxide film 150, which is covered by the insulating layer 160, remains as the low oxygen concentration region L1 as it is. This is because there is a concern that the insulating layer 160 plays a role analogous to the mask layer, and oxygen is bound to the low oxygen concentration region L1.

Figure 8:
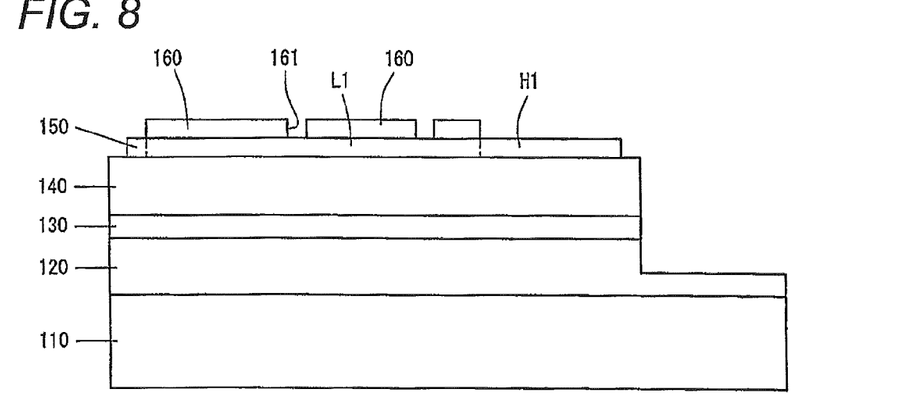
FIG. 8 is a view (Part 5) for explaining a method for manufacturing a semiconductor light emitting element according to the embodiment.

3-7. (Step G) Perforating Step:

Subsequently, as shown in FIG. 8, the insulating layer 160 is perforated. This perforation is performed by means of etching or the like. According to this, pores 161 are formed. The pore 161 is one for forming the contact portion 171.

Figure 9:
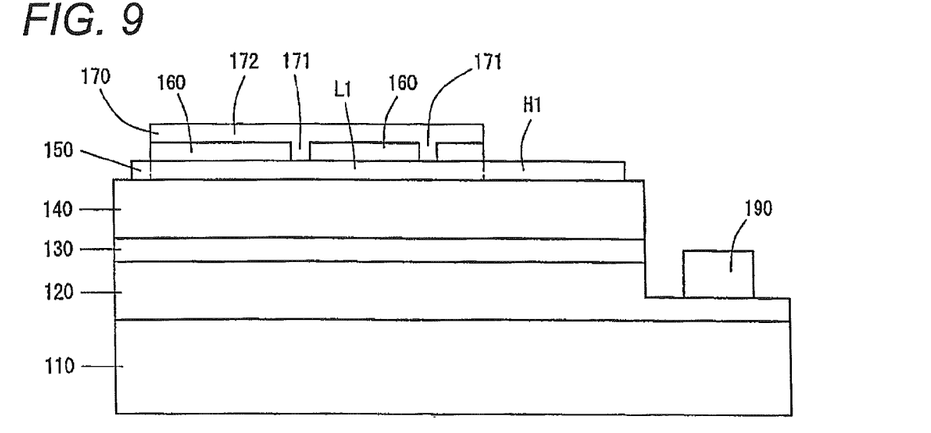
FIG. 9 is a view (Part 6) for explaining a method for manufacturing a semiconductor light emitting element according to the embodiment.

3-8. (Step H) Electrode Forming Step:

Subsequently, as shown in FIG. 9, an electrode is formed. Here, the formation of an electrode may be performed by forming the wiring electrodes 170 and 190. On that occasion, these wiring electrodes may be formed at the same time in the same step.

3-9. (Step I) Insulating Film Forming Step:

After forming the electrodes, the insulating film 180 is formed. On that occasion, the insulating film 180 is formed so as to cover the side faces of the wiring electrode 170 and the semiconductor layers and the like, too. At that time, the insulating film 180 may also be formed excluding the exposed portions P1 and N1; or after covering by the insulating film, the exposed portions P1 and N1 may also be formed by removing the exposed areas of the insulating film. In this way, the light emitting element 100 shown in FIG. 2 was manufactured. Incidentally, the order of the foregoing steps may be properly changed. In addition, as a matter of course, other step than those described herein may be added.

Incidentally, in the thus manufactured light emitting element 100, at least a part of the insulating layer 160 remains on the transparent conductive metal oxide film 150.

4. Modification Example:

4-1. Material of Transparent Conductive Metal Oxide Film:

In the present embodiment, the material of the transparent conductive metal oxide film 150 was made of ITO or IZO. But, the material of the transparent conductive metal oxide film 150 may also be a compound obtained by adding $In_2O_3$ with other metal. This is because even in that case, by applying the heat treatment in an oxygen-containing atmosphere, the high oxygen concentration region H1 and the low oxygen concentration region L1 can be formed within the region of the transparent conductive metal oxide film 150.

4-2. Roughing of Insulating Film:

In addition, the insulating film 180 may also be roughed. This is because the light extraction efficiency is enhanced.

4-3. Reflectance:

In order to enhance the reflectance, the insulating layer 160 may also be formed of a dielectric multilayer film. In addition, a metal layer made of Al, Ag, or the like may also be formed on the top and bottom of the insulating layer 160. This is made for the purpose of increasing the reflectance.

Figure 10:
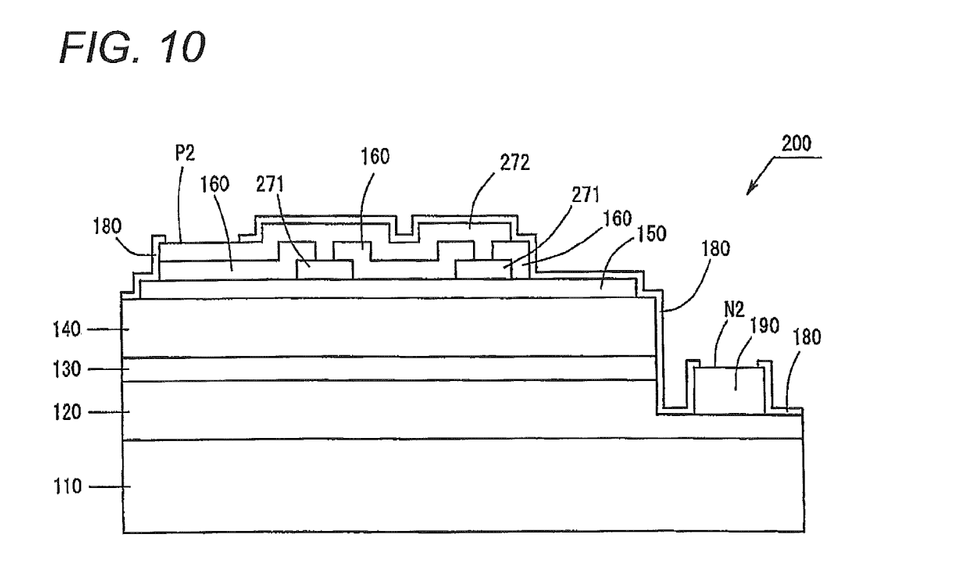
FIG. 10 is a cross-sectional view showing a diagrammatic configuration of another semiconductor light emitting device according to Embodiment 1.

4-4. Contact Electrode:

In the present embodiment, the contact portions 171 and the wiring portion 172 were integrated with each other. But, these may be made separated from each other. In that case, as shown in FIG. 10, a light emitting element 200 include contact portions 271 as separate bodies and a wiring portion 272.

5. Summary:

As described above in detail, the light emitting element 100 according to the present embodiment includes the transparent conductive metal oxide film 150 coming into ohmic contact with the semiconductor layer. The transparent conductive metal oxide film 150 includes the low oxygen concentration region L1 and the high oxygen concentration region H1 having a higher oxygen concentration than the low oxygen concentration region L1. The electric current to be injected from the electrode diffuses easily into the transverse direction (direction within the light emitting surface) in the low oxygen concentration region L1 and flows easily in the longitudinal direction (direction perpendicular to the light emitting surface) in the high oxygen concentration region H1. Accordingly, the electric current which has diffused sufficiently within the light emitting surface flows through the semiconductor layer in the transparent conductive metal oxide film 150. Accordingly, the luminous efficiency of the light emitting element 100 is good.

In addition, in the method for manufacturing the light emitting element 100 according to the present embodiment, the formation of a transparent conductive metal oxide film twice as in Patent Document 1 is not necessary. Accordingly, the productivity is good. In addition, in the light emitting element 100, the low oxygen concentration region L1 and the high oxygen concentration region H1 occupy the single transparent conductive metal oxide film 150. In consequence, the light emitting element 100 is free from an increase of the resistance due to a contact resistance at the joining surface as in the semiconductor light emitting element described in Patent Document 1, in which the two transparent conductive metal oxide films are joined.

Incidentally, the present embodiment is merely illustration. In consequence, as a matter of course, various improvements and modifications can be made herein within the range where the gist thereof is not deviated. In the present embodiment, in forming the semiconductor layer, the metal organic chemical vapor deposition (MOCVD) was adopted. But, other methods such as vapor phase epitaxy, for example, hydride vapor phase epitaxy (HVPE), and molecular beam epitaxy (MBE) may also be adopted.

(Embodiment 2)

Embodiment 2 is described. The present embodiment is different from Embodiment 1 with respect to the relation between the width of the insulating layer and the width of the wiring electrode 170 in the semiconductor light emitting element. In consequence, only points which are different from those in Embodiment 1 are described.

Figure 11:
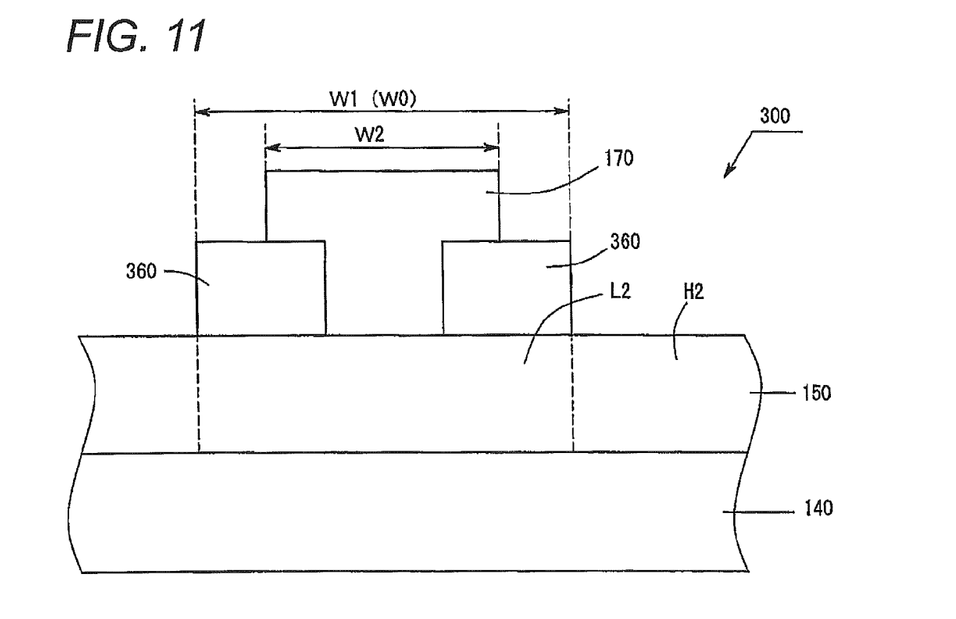
FIG. 11 is a cross-sectional view enlarging the vicinity of a wiring electrode of a semiconductor light emitting element according to Embodiment 2.

1. Semiconductor Light Emitting Element:

The vicinity of the electrode of a light emitting element 300 according to the present embodiment is shown in FIG. 11. As shown in FIG. 11, in the light emitting element 300, a width W1 of an insulating layer 360 is wider than a width W2 of the wiring electrode 170.

In the light emitting element 300, the transparent conductive electrode metal oxide film 150 also includes a low oxygen concentration region L2 and a high oxygen concentration region H2. The low oxygen concentration region L2 is a region which is covered by the insulating layer 360. The high oxygen concentration region H2 is a region which is not covered by the insulating layer 360. Accordingly, the surface of the high oxygen concentration region H2 is exposed. The oxygen concentrations in the low oxygen concentration region L2 and the high oxygen concentration region H2 are substantially the same as the oxygen concentrations of the low oxygen concentration region L1 and the high oxygen concentration region H1.

In this way, the width W1 of the insulating layer 360 is the same as a region width W0 of the low oxygen concentration region L2. But, a width W2 of the wiring electrode 170 is narrower than the region width W0 of the low oxygen concentration region L2.

(Embodiment 3)

Embodiment 3 is described. The present embodiment is different from Embodiment 1 with respect to the method for manufacturing a semiconductor light emitting element. In consequence, the description is made centering on different points. The description regarding overlapping points is omitted.

1. Method for Manufacturing Semiconductor Light Emitting Element:

The present embodiment is characterized in that not only the insulating layer but the wiring electrode is used as a mask for the oxidation treatment.

The method for manufacturing a semiconductor light emitting element according to the present embodiment is a method including the following steps of from Step A to Step I. However, the present embodiment is different from Embodiment 1 with respect to the order of the steps to be carried out.

(Step A) Semiconductor layer forming step
(Step B) Transparent conductive metal oxide film forming step
(Step C) First heat treatment step (low oxygen concentration region forming step)
(Step D) n-Type layer exposing step
(Step E) Insulating layer forming step
(Step G) Perforating step
(Step H) Electrode forming step
(Step F) Second heat treatment step (high oxygen concentration region forming step)
(Step I) Insulating film forming step These respective steps are carried out in this order. In other words, the present embodiment is different from Embodiment 1 with respect to the order of the steps to be carried out. The manufacturing method according to the present embodiment is the same as the manufacturing method according to Embodiment 1 with respect to the steps up to the insulating layer forming step (Step E). In consequence, the steps after that are described.

1-1. (Step G) Perforating Step:

After forming the insulating layer 160 on the transparent conductive oxide film 150, the holes 161 are bored in the insulating layer 160. These holes 161 are those for forming the contact portions 171 of the wiring electrode 170 on the transparent conductive metal oxide film 150. In addition, it is desirable to bore the area for forming the wiring electrode 190 in the same manner.

1-2. (Step H) Electrode Forming Step:

Subsequently, the wiring electrodes 170 and 190 are formed. These wiring electrodes can be formed at the same time in the same step. At this stage, the insulating layer 160 and the wiring electrode 170 are formed in the region which becomes the low oxygen concentration region in the transparent conductive metal oxide film 150. The insulating layer 160 and the wiring electrode 170 play a role as a mask for the oxidation treatment of the transparent conductive metal oxide film 150.

1-3. (Step F) Second Heat Treatment Step (High Oxygen Concentration Region Forming Step)

Subsequently, a heat treatment is performed in an oxygen-containing atmosphere. This heat treatment step can be performed in the same manner as that in Embodiment 1. Thereafter, the light emitting element 100 can be manufactured by forming an insulating film in the insulating film forming step (Step I).

Incidentally, in the manufactured light emitting element, at least a part of each of the insulating layer 160 and the wiring electrode 170 remains on the transparent conductive metal oxide film 150.

(Embodiment 4)

Embodiment 4 is described. The present embodiment is different from Embodiment 1 with respect to the method for manufacturing a semiconductor light emitting element. As a result, the ranges of the low oxygen concentration region and the high oxygen concentration region in the semiconductor light emitting element are also different from those in Embodiment 1.

Figure 12:
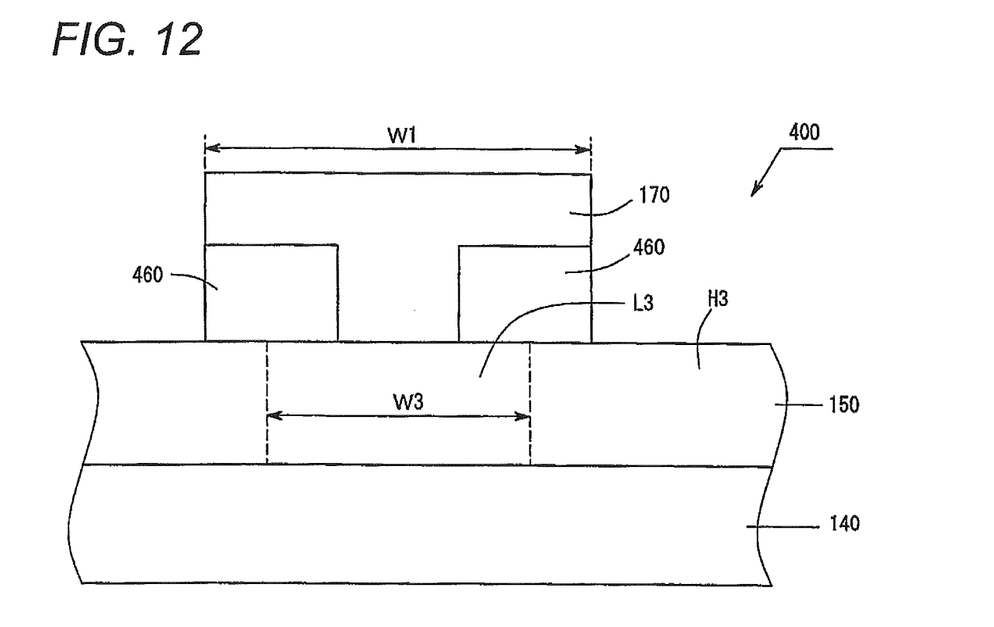
FIG. 12 is a cross-sectional view enlarging the vicinity of a wiring electrode of a semiconductor light emitting element according to Embodiment 4.

1. Semiconductor Light Emitting Element:

The vicinity of the electrode of a light emitting element 400 according to the present embodiment is shown in FIG. 12. In FIG. 12, a width W3 of a low oxygen concentration region L3 is narrower than a width W1 of an insulating layer 460. Conversely, the width of the low oxygen concentration region L3 may be made wider than the width W1 of the insulating layer 460. This is because as described later, a separate mask is formed without making the insulating layer 460 as a mask layer, thereby performing a heat treatment step.

2. Method for Manufacturing Semiconductor Light Emitting Element:

The method for manufacturing a semiconductor light emitting element according to the present embodiment is a method including the following steps of from Step A to Step I.

(Step A) Semiconductor layer forming step
(Step B) Transparent conductive metal oxide film forming step
(Step C) First heat treatment step (low oxygen concentration region forming step)
(Step D) n-Type layer exposing step
(Step J) Mask layer forming step
(Step F) Second heat treatment step (high oxygen concentration region forming step)
(Step K) Mask layer removing step (Step E) Insulating layer forming step
(Step G) Perforating step
(Step H) Electrode forming step
(Step I) Insulating film forming step These respective steps are carried out in this order. Step J and Step K are added to the steps of Embodiment 1. The manufacturing method according to the present embodiment is the same as the manufacturing method according to Embodiment 1 with respect to the steps up to the n-type layer exposing step (Step D).

Figure 13:
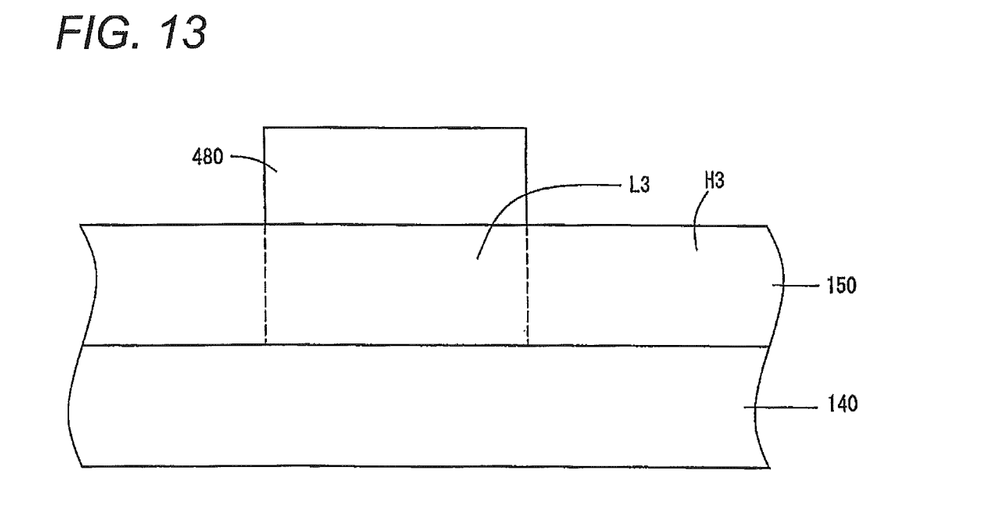
FIG. 13 is a view for explaining a method for manufacturing a semiconductor light emitting element according to Embodiment 4.

2-1. (Step J) Mask Layer Forming Step:

Subsequently, as shown in FIG. 13, a mask layer 480 is formed on the transparent conductive metal oxide film 150. As the material of this mask layer 480, for example, $SiO_2$ can be used. The mask layer 480 is a mask for preventing oxidation of the transparent conductive metal oxide film 150 from occurring. Thus, various materials can be used so long as they are able to cover sufficiently the transparent conductive metal oxide film 150 and can be removed later without allowing oxygen to pass through the transparent conductive metal oxide film 150.

2-2. (Step F) Second Heat Treatment Step (High Oxygen Concentration Region Forming Step):

Subsequently, a heat treatment is performed in an oxygen-containing atmosphere. A condition of this heat treatment may be the same as that in Embodiment 1. According to this, an area which is not covered by the mask layer 480 is high in terms of an oxygen concentration and becomes a high oxygen concentration region H3. An area which is covered by the mask layer 480 remains in a low oxygen concentration state as it is and becomes a low oxygen concentration region L3.

2-3. (Step K) Mask Layer Removing Step

Subsequently, the mask layer 480 is removed. For achieving the removal, photolithography, etching, or the like can be adopted.

Subsequently, the insulating layer forming step (Step E) is carried out. The steps of the perforating step (Step G), et seq. are the same as those in Embodiment 1. After removing the mask layer 480, the insulating layer 460 is formed, and then, a wiring electrode is formed.

3. Manufactured Semiconductor Light Emitting Element:

The region width W3 of this low oxygen concentration region L3 does not always conform to the width W1 for covering the insulating layer 460. The region width W3 of the low oxygen concentration region L3 is the same as the width of the forming region of the mask layer 480.

What is claimed is:

1. A method for manufacturing a semiconductor light emitting element, the method comprising:
    forming a semiconductor layer comprising a Group III nitride based compound semiconductor on a principal surface of a substrate;
    forming a transparent conductive metal oxide film on the semiconductor layer;
    forming a mask layer directly contacting a part of the transparent conductive metal oxide film; and heat treating of the transparent conductive metal oxide film having the mask layer formed thereon in an oxygen-containing atmosphere,
    wherein, in the heat treating an oxygen concentration of a remaining part of the transparent conductive metal oxide film which is not covered by the mask layer is made higher than an oxygen concentration of a part of the transparent conductive metal oxide film which is covered by the masklayer; and
    forming an electrode over the mask layer that directly contacts a portion of the transparent conductive metal oxide film having the lower oxygen concentration through perforations formed in the mask layer.

2. The method for manufacturing a semiconductor light emitting element according to claim 1, wherein the mask layer comprises an insulating layer, and at least a part of the insulating layer remains on the transparent conductive metal oxide film.

3. The method for manufacturing a semiconductor light emitting element according to claim 1, wherein the mask layer comprises an insulating layer and the electrode, and
    wherein at least a part of each of the insulating layer and the electrode remains on the transparent conductive metal oxide film.

4. The method for manufacturing a semiconductor light emitting element according to claim 1, further comprising:
    after the heat treating removing the mask layer from the transparent conductive metal oxide film,
    wherein, after said removing the mask layer, said forming of the electrode is performed.

5. The method for manufacturing a semiconductor light emitting element according to claim 1, further comprising:
    prior to said forming the mask layer performing a heat treatment in an oxygen-free atmosphere,
    wherein a heat treatment temperature in the heat treatment in the oxygen-free atmosphere is higher than a heat treatment temperature in the heat treating in the oxygen-containing atmosphere.

6. The method for manufacturing a semiconductor light emitting element according to claim 1, wherein the mask layer comprises an insulating layer.

7. The method for manufacturing a semiconductor light emitting element according to claim 6, wherein at least a part of each of the insulating layer and the electrode remains on the transparent conductive metal oxide film.

8. The method for manufacturing a semiconductor light emitting element according to claim 1, wherein at least a part of the mask layer remains on the transparent conductive metal oxide film.

9. The method for manufacturing a semiconductor light emitting element according to claim 1, wherein, after said forming the electrode, at least a part of the mask layer remains on the transparent conductive metal oxide film.

10. The method for manufacturing a semiconductor light emitting element according to claim 1, wherein, after said forming the electrode, at least a part of the mask layer and the electrode remain on the transparent conductive metal oxide film.

11. A method for manufacturing a semiconductor light emitting element, the method comprising:
    forming a semiconductor layer comprising a Group III nitride based compound semiconductor formed on a principal surface of a substrate;
    forming a transparent conductive metal oxide film on the semiconductor layer; and
    forming a low oxygen concentration region and a high oxygen concentration region, having a higher oxygen concentration than the low oxygen concentration region, in the transparent conductive metal oxide film, region; and
    forming an electrode conducting to the transparent conductive metal oxide film, wherein
    the electrode is formed over a mask layer and directly contacting the low oxygen concentration region through perforations formed in the mask layer, and
    the electrode is disposed within the low oxygen concentration region.

12. The method according to claim 11, wherein said forming the low oxygenconcentration region and the high oxygen concentration region comprises:
- forming the mask layer for covering a part of the transparent conductive metal oxide film; and
- a heat treatment of the transparent conductive metal oxide film having the mask layer formed thereon in an oxygen-containing atmosphere.

13. The method according to claim 12, wherein, in the heat treating, an oxygen concentration of the high oxygen concentration region, which is not covered by the mask layer, is made higher than an oxygen concentration of the low oxygen concentration region, which is covered by the mask layer.

14. The method according to claim 12, wherein the mask layer comprises an insulating layer, and at least a part of the insulating layer remains on the transparent conductive metal oxide film.

15. The method according to claim 12, wherein the mask layer comprises an insulating layer and the electrode, and
- wherein at least a part of each of the insulating layer and the electrode remains on the transparent conductive metal oxide film.

16. The method according to claim 12, wherein, after said forming the electrode, at least a part of each of the mask layer and the electrode remains on the transparent conductive metal oxide film.

* * * * *